(12) United States Patent
Fujimoto

(10) Patent No.: US 6,645,823 B2
(45) Date of Patent: Nov. 11, 2003

(54) RETICLE AND METHOD OF FABRICATING SEMICONDUCTOR DEVICE

(75) Inventor: Masashi Fujimoto, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/056,540

(22) Filed: Jan. 25, 2002

(65) Prior Publication Data

US 2002/0093110 A1 Jul. 18, 2002

Related U.S. Application Data

(62) Division of application No. 09/611,580, filed on Jul. 5, 2000.

(30) Foreign Application Priority Data

Jul. 9, 1999 (JP) ............................................ 11-196766

(51) Int. Cl.[7] .......................... H01L 21/76; H01L 21/00; H01L 23/544; H01L 23/58; G01S 1/00
(52) U.S. Cl. ...................... 438/401; 438/800; 438/462; 257/797; 257/798; 250/491.1; 250/492.2; 250/492.22; 250/397; 250/398
(58) Field of Search ................................. 438/401, 800, 438/462; 257/797, 800, 798; 250/491.1, 492.2, 492.22, 397, 398

(56) References Cited

U.S. PATENT DOCUMENTS

| | | | |
|---|---|---|---|
| 4,759,626 A | 7/1988 | Kroko | |
| 5,242,770 A | 9/1993 | Chen et al. | |
| 5,365,072 A | 11/1994 | Turner et al. | |
| 5,444,538 A | 8/1995 | Pellegrini | |
| 5,477,058 A | 12/1995 | Sato | |
| 5,498,500 A | 3/1996 | Bae | |
| 5,570,405 A | 10/1996 | Chan et al. | |
| 5,580,829 A | * 12/1996 | Browning et al. | .......... 437/226 |
| 5,633,505 A | 5/1997 | Chung et al. | |
| 5,667,918 A | 9/1997 | Brainerd et al. | |
| 5,677,092 A | 10/1997 | Takekuma et al. | |
| 5,731,113 A | 3/1998 | Ueno | |
| 5,982,044 A | 11/1999 | Lin et al. | |
| 6,042,946 A | 3/2000 | Chiang et al. | |
| 6,083,807 A | 7/2000 | Hsu | |
| 6,118,128 A | 9/2000 | Kojima | |
| 6,204,509 B1 | 3/2001 | Yahiro et al. | |
| 6,251,745 B1 | 6/2001 | Yu | |

FOREIGN PATENT DOCUMENTS

| | | |
|---|---|---|
| GB | 2 123 980 A | 2/1984 |
| JP | 3-230514 | 10/1991 |
| JP | 4-361548 | 2/1992 |
| JP | 09-034100 | 2/1997 |
| JP | 10-213895 | 8/1998 |
| JP | 10-312994 | 11/1998 |

* cited by examiner

*Primary Examiner*—Wael Fahmy
*Assistant Examiner*—Shrinivas H. Rao
(74) *Attorney, Agent, or Firm*—Katten Muchin Zavis Rosenman

(57) ABSTRACT

A semiconductor manufacturing method employing optical lithography, using a reticle for lithographic alignment. The reticle includes a first area having a desired circuit pattern, and a second area including alignment marks arranged at specific positions, each area being located in an exposure range of an optical exposure apparatus. Each of the alignment marks includes mark elements arranged to form a first geometric shape. Each of the mark elements has main sub-elements arranged in a specific direction at first pitches to form a second geometric shape, and auxiliary sub-elements located at each end of the second geometric shape. Each auxiliary sub-element is apart from one of the main sub-elements at a second pitch. Each main sub-element is optically resolvable, while each auxiliary sub-element is optically irresolvable. Each of the main and auxiliary sub-elements preferably has a linear shape.

7 Claims, 13 Drawing Sheets

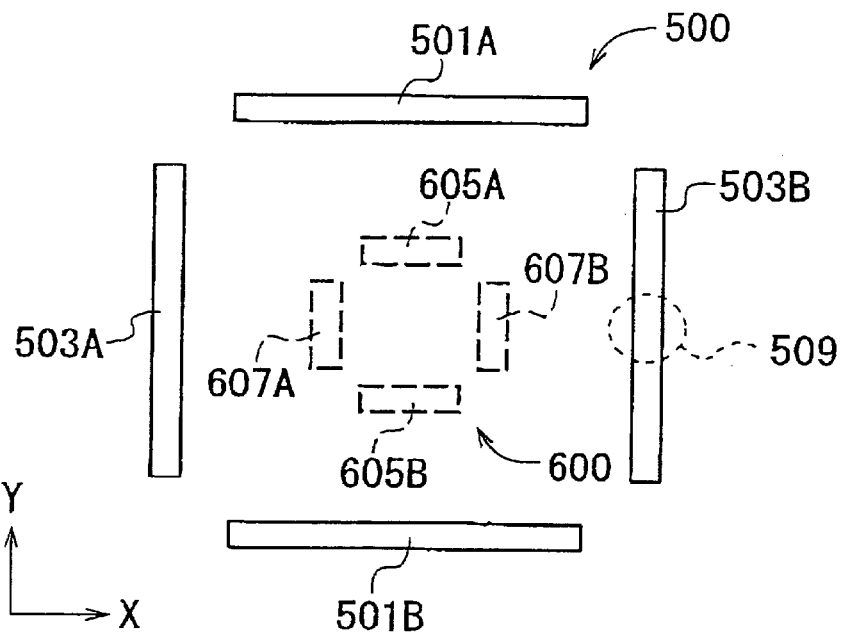
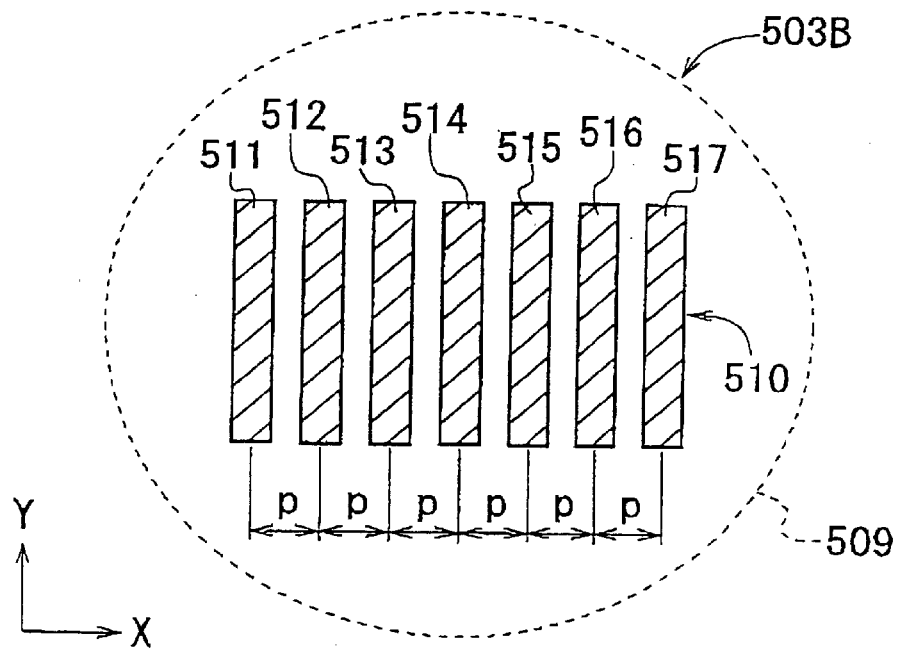

RETICLE AND METHOD OF FABRICATING SEMICONDUCTOR DEVICE

CROSS REFERENCE TO RELATED APPLICATION

This application is a Divisional of application Ser. No. 09/611,580, filed on Jul. 5, 2000.

BACKGROUND OF THE INVENTION

1. Field of the Invention

The present invention relates to semiconductor device fabrication and more particularly, to a reticle that improves the alignment or stacking accuracy in the lithographic process for fabricating semiconductor devices, and a method of fabricating a semiconductor device that uses a reticle improving the alignment or stacking accuracy in the lithographic process.

2. Description of the Related Art

The lithography technique, which is used to transfer patterns of geometric shapes for on a mask to a thin resist layer, plays an important role in the process sequence of fabricating Ultra-Large Scale Integrated semiconductor devices (ULSIs). To conduct the lithographic process adequately, there is the need to form minute patterns of geometric shapes on a reticle (hereinafter, reticle patterns) as correct as possible and to align or stack the reticle patterns to the patterns of an underlying layer at as high accuracy as possible.

With the reduction step-and-repeat projection exposure system (which is simply called the "stepper"), which has been usually used for the optical lithographic process in the ULSI fabrication process sequence, the optical lenses have some aberration and therefore, an image of the reticle patterns transferred to a resist layer on the semiconductor wafer has image distortion and positional distortion. The amount of the image and positional distortions varies dependent on the size and pitch of the reticle patterns.

To meet the above-described need to form the reticle patterns as correct as possible and to align the reticle patterns to the underlying layer at as high accuracy as possible, an improved reticle was developed and disclosed in the Japanese Non-Examined Patent Publication No. 10-213895 published in August 1998. The improved reticle includes alignment marks, each of which is formed by the combination of geometric shapes having the same size and the same shape as the geometric shapes that form the circuit pattern in each chip site of the wafer. For example, if the reticle is designed for circular or square contact holes, the alignment mark is formed by the combination of circular or square shapes having the same size as the circular or square contact holes. The circular or square shapes are arranged regularly to define the contour of the alignment mark.

With the improved reticle disclosed in the Publication No. 10-213895, the circuit patterns formed in the chip area and the alignment mark pattern formed in the scribe line area have a specific geometric correlation and thus, the amount of the image and positional distortions generated in the chip area is substantially equal to the scribe line area. Accordingly, the alignment or stacking accuracy of the circuit patterns in the chip area is correctly recognizable by measuring the alignment or stacking accuracy of the alignment mark. This makes it possible to cope with further miniaturization of circuit patterns in the optical lithographic process.

Next, the alignment mark of the improved reticle disclosed in the Publication No. 10-213895 is explained in more detail below with reference to FIG. 1.

As seen from FIG. 1, the alignment mark 500 of the prior-art reticle comprises four rectangular mark elements 501A, 501B, 503A, and 503B, which are arranged to form an imaginary rectangle in the scribe line area of the reticle. The two elements 501A and 501B, which extend along the X-axis, are parallel to and apart from each other by a specific distance. The two elements 503A and 503B, which extend along the Y-axis perpendicular to the X-axis, are parallel to and apart from each other by a specific distance.

The prior-art reticle with the mark 500 is applied to the upper one of the two adjoining layers. Another alignment mark 600 due to another reticle, which is additionally shown by broken lines in FIG. 1, is formed on the lower one of the two layers. This is to exhibit the positional relationship between these marks 500 and 600.

Similar to the upper-layer mark 500, the lower-layer mark 600 comprises four rectangular mark elements 605A, 605B, 607A, and 607B, which are arranged to form an imaginary rectangle smaller than that of the mark 500 in the scribe line area. The two elements 605A and 605B, which extend along the X-axis, are parallel and apart from each other by a specific distance. The two elements 607A and 607B, which extend along the Y-axis perpendicular to the X-axis, are parallel and apart From each other by a specific distance. As shown in FIG. 1, the mark 500 is located to surround entirely the mark 600.

FIG. 2 shows the detailed structure of the part 509 of the mark element 503B of the mark 500 shown in FIG. 1. As shown in FIG. 2, the part 509 of the element 503B includes a pattern 510 comprising seven linear sub-elements 511, 512, 513, 514, 515, 516, and 517 with the same size and the same shape. These sub-elements 511 to 517 are formed to extend parallel to the Y-axis and are arranged along the X-axis at equal pitches p. The pitch p is equal to the pitch of the linear sub-elements of the circuit pattern formed in the chip area of the reticle. A plurality of the patterns 510 are arranged at regular intervals along the Y-axis, thereby forming the element 503B.

The mark element 503A has the same structure as the element 503B shown in FIG. 2. The alignment mark elements 501A and 501B have the structure obtained by turning the element 503B by 90° around the center of the imaginary rectangle of the mark 500.

When the prior-art reticle having the alignment mark 500 is used in the optical lithographic process, the following pattern is formed on an optical resist layer over a semiconductor wafer. The pattern formed in the resist layer is termed the "resist pattern" in the following explanation.

FIG. 3 shows an example of the resist pattern 520 obtained from the pattern 510 of the element 503B of the prior-art alignment mark 500, which is formed by conducting the optical lithographic process using an ideal optical system of a so-called stepper without any aberration.

As shown in FIG. 3, the resist pattern 520 comprises seven linear sub-elements 521, 522, 523, 524, 525, 526, and 527 corresponding to the seven linear sub-elements 511, 512, 513, 514, 515, 516, and 517 of the pattern 510 of the element 503B. Since it is supposed that the optical system of the stepper includes no aberration, as shown in FIG. 3, the centerlines CL21, CL22, CL23, CL24, CL25, CL26, and CL27 of the sub-elements 521 to 527 are respectively located on their specific reference positions. In other words, the centerlines CL21 to CL27 of the sub-elements 521 to 527 have no positional shift with respect to their reference positions.

FIG. 4 shows an example of the resist pattern 530 obtained from the pattern 510 of the element 503B of the prior-art alignment mark 500, which is formed by conducting the optical lithographic process using an actual optical system of a so-called stepper with aberration.

As shown in FIG. 4, the resist pattern 530 comprises seven linear sub-elements 531, 532, 533, 534, 535, 536, and 537 corresponding to the seven linear sub-elements 511, 512, 513, 514, 515, 516, and 517 of the pattern 510 of the element 503B.

Since the optical system of the stepper includes some aberration, as shown in FIG. 4, the sub-elements 531 to 537 have positional shifts with respect to their reference positions (i.e., the sub-elements 521 to 527 in FIG. 3), respectively. Specifically, the centerlines CL31, CL32, CL33, CL34, CL35, CL36, and CL37 of the sub-elements 531 to 537 are respectively deviated from the centerlines CL21, CL22, CL23, CL24, CL25, CL26, and CL27 located respectively on their reference positions by specific shifts C, D, E, F, G, H, and I. The shifts C and I of the sub-elements 531 and 537 located at the right and left edges are larger than the shifts D, E, F, G, and H of the shapes 532, 533, 534, 535, and 536 located inwardly.

The difference between the shifts C and I and the shifts D, E, F, G, and H is caused by the diffraction level difference of the irradiated light. This is due to the fact that the sub-elements 511 and 517 of the pattern 510 of the alignment mark 500 are half-isolated (i.e., only the sub-elements 512 and 516 are respectively placed adjacent to the sub-elements 511 and 517) while the sub-elements 512, 513, 514, 515, and 516 are not isolated (i.e., two sub-elements are respectively placed at both side of each sub-element 512, 513, 514, 515, or 516). Thus, the optical images corresponding to the sub-elements 511 and 517 have larger shifts than those corresponding to the sub-elements 512 to 516. As a result, the shifts C and I of the sub-elements 531 and 537 of the resist pattern 530 are larger than the shifts D, E, F, G, and H of the sub-elements 532 to 536. In other words, the spacial frequency characteristic of the sub-elements 531 and 537 located at the edges of the resist pattern 530 is different from that of the sub-elements 532 to 536 located inside the resist pattern 530.

Generally speaking, coma aberration of an optical system varies dependent on its spacial frequency characteristic. Accordingly, with the above-described prior-art reticle, due to the difference of the spacial frequency characteristic, the alignment or stacking accuracy of the circuit pattern formed in the chip area is unequal to that of the alignment mark 500 formed in the scribe line area, resulting in a problem of alignment or stacking error of the circuit pattern.

Specifically, if the sub-elements 511 to 517 of the pattern 510 of the alignment mark 500 produce the resist pattern 530 with the linear sub-elements 531 to 537 shown in FIG. 5A, the linear sub-elements 531 to 537 of the resist pattern 530 result in the reflected-light intensity distribution shown in FIG. 5B. In this case, the alignment or staking accuracy of the circuit pattern on the reticle with respect to the circuit pattern of the underlying layer is measured by recognizing or detecting the edges 531a and 537a of the sub-elements 531 and 537 located at the edges of the resist pattern 530 from the reflected-light intensity distribution of FIG. 5E. Accordingly, if the spacial frequency characteristic of the sub-elements 531 and 537 is different from that of the inner sub-elements 532 to 536, the measurement result using the alignment mark 500 located in the scribe line area of the reticle reflects incorrectly the alignment or staking accuracy of the circuit pattern located in the chip area of the same reticle. This incorrectness will degrade the alignment or stacking accuracy of the optical lithographic process itself.

Because of the above-described reason, it is desirable to provide a reticle with an alignment mark that eliminates the spacial frequency characteristic error or difference of the sub-elements of the resist pattern, thereby reducing the incorrectness in the measurement result about the alignment accuracy of the circuit pattern.

Also, it is desirable to provide an improved method of fabricating a semiconductor device that equalizes the spacial frequency characteristic of the alignment mark pattern formed in the scribe line area of the reticle to that of the circuit pattern formed in the chip area of the same reticle.

SUMMARY OF THE INVENTION

Accordingly, an object of the present invention is to provide a reticle and a method of fabricating a semiconductor device that improve the alignment or stacking accuracy in the optical lithographic process.

Another object of the present invention is to provide a reticle and a method of fabricating a semiconductor device that reduce the error or incorrectness of alignment accuracy measurement using the alignment mark in the optical lithographic process.

The above objects together with others not specifically mentioned will become clear to those skilled in the art from the following description.

According to a first aspect of the present invention, a reticle is provided, which comprises a first area including a desired circuit pattern and a second area including alignment marks arranged at specific positions, the first area and the second area being located in an exposure range of an optical exposure apparatus.

Each of the alignment marks comprises mark elements arranged to form a first geometric shape.

Each of the mark elements has main sub-elements arranged in a specific direction at first pitches to from a second geometric shape, a first auxiliary sub-element located at one end of the second geometric shape, a second auxiliary sub-element located at the other end of the second geometric shape. The first auxiliary sub-element is apart from a first one of the main sub-elements at a second pitch. The second auxiliary sub-element is apart from a second one of the main sub-elements at a third pitch.

Each of the main sub-elements is resolvable in the apparatus. Each of the first and second auxiliary sub-elements is irresolvable in the apparatus.

With the reticle according to the first aspect of the present invention, each of the alignment marks, which are formed in the second area, comprises mark elements arranged to form a first geometric shape. Each of the mark elements has main sub-elements arranged in a specific direction at first pitches to from a second geometric shape, a first auxiliary sub-element located at one end of the second geometric shape, a second auxiliary sub-element located at the other end of the second geometric shape. The first auxiliary sub-element is apart from a first one of the main sub-elements at a second pitch. The second auxiliary sub-element is apart from a second one of the main sub-elements at a third pitch. Each of the main sub-elements is resolvable in the apparatus. Each of the first and second auxiliary sub-elements is irresolvable in the apparatus.

Accordingly, when specific light is irradiated to a resist layer through the reticle using the optical exposure apparatus, the first and second auxiliary sub-elements of each alignment mark do not form any optical images in the resist layer. On the other hand, the main sub-elements of each alignment mark form optical images with substantially equal aberration-induced shifts in the resist layer. This is because each of the main sub-elements is not isolated due to existence of the first and second auxiliary sub-elements.

As a result, only the main sub-elements of each alignment mark can be selectively transferred to the resist layer by the optical exposure apparatus without unequal aberration-induced shifts in the images of each alignment mark. In other words, all the images of the main sub-elements of each alignment mark in the resist layer exhibit a correct spacial frequency characteristic according to the first pitches of the main sub-elements when the alignment accuracy is measured.

Thus, the alignment accuracy is improved in the optical lithographic process using the reticle with the alignment mark. This means that the error or incorrectness of alignment accuracy measurement using the alignment marks in the optical lithographic process is reduced.

In a preferred embodiment of the reticle according to the first aspect, each of the main sub-elements has a linear shape, and each of the first and second auxiliary sub-elements has a linear shape. In this embodiment, there is an additional advantage that the main sub-elements and the first and second auxiliary sub-elements can be easily formed on the reticle at equal pitches to the circuit pattern in the first area and therefore, the alignment accuracy is further improved.

In another preferred embodiment of the reticle according to the first aspect, each of the main sub-elements has a linear shape with a width greater than a specific threshold width equal to an exposure limit of the apparatus. Each of the first and second auxiliary sub-elements has a linear shape with a width equal to or less than the specific threshold widt.h In this embodiment, along with the additional advantage that the alignment accuracy is further improved, there is another additional advantage that each of the main sub-elements can be easily made resolvable and each of the first and second auxiliary sub-elements can be easily made irresolvable in the apparatus.

In the above-identified preferred embodiments of the reticle according to the first aspect, the linear shape of each of the main sub-elements may be continuous or broken (or divided) between its two ends. Similarly, the linear shape of each of the first and second auxiliary sub-elements may be continuous or broken (or divided) between its two ends.

In still another preferred embodiment of the reticle according to the first aspect, the specific direction in which the main sub-elements are arranged is a measuring direction in alignment accuracy measurement.

In a further preferred embodiment of the reticle according to the first aspect, the second pitch of the first auxiliary sub-element and the third pitch of the second auxiliary sub-element are approximately equal to the first pitch of the main sub-elements. In this embodiment, there is an additional advantage that the first and second auxiliary sub-elements can be easily formed on the reticle.

In a still further preferred embodiment of the reticle according to the first aspect, the first pitch of the main sub-elements is substantially equal to a pitch of the circuit pattern formed in the first area. In this embodiment, there is an additional advantage that the reproducibility of the alignment accuracy in the optical lithographic process is enhanced.

In a still further preferred embodiment of the reticle according to the first aspect, a third auxiliary sub-element and a fourth auxiliary sub-element are additionally provided to be arranged in the specific direction of the main sub-elements. The third auxiliary sub-element is located to be adjacent to the first auxiliary sub-element at a fourth pitch. The fourth auxiliary sub-element is located to be adjacent to the second auxiliary sub-element at a fifth pitch. In this embodiment, the above-described advantages of the reticle according to the first aspect are, further enhanced.

Preferably, each of the third and fourth auxiliary sub-elements has a linear shape, or each of the third and fourth auxiliary sub-elements has a linear shape with a width equal to or less than the specific threshold width. The linear shape of each of the third and fourth auxiliary sub-elements may be continuous or broken (or divided) between its two-ends.

According to a second aspect of the present invention, a method of fabricating a semiconductor device is provided, which comprises the steps of:

(a) forming an optical resist layer on a target layer located over a surface of a semiconductor wafer;

(b) irradiating light to the resist layer through a reticle comprising a first area-including a desired circuit pattern and a second area including alignment marks arranged at specific positions;

the first area and the second area being located in an exposure range of the light;

each of the alignment marks comprising mark elements arranged to form a first geometric shape;

each of the mark elements having sub-elements arranged in a specific direction at specific pitches to from a second geometric shape;

(c) developing the resist layer exposed to the light to form a resist circuit pattern and resist alignment-mark patterns in the resist layer from the circuit pattern and the alignment marks on the reticle, respectively;

each of the resist alignment-mark patterns including resist sub-patterns corresponding to the sub-elements arranged in the specific direction;

(d) selectively removing two ones of the resist sub-patterns located at their two ends from each of the resist alignment-mark patterns, forming amended resist alignment-mark patterns in the resist layer;

(e) measuring alignment accuracy of the resist layer with respect to an underlying layer of the target layer using the amended resist alignment-mark patterns; and (f) selectively etching the target layer using the resist layer with the amended resist alignment-mark patterns.

With the method of a semiconductor device according to the second aspect of the present invention, the resist layer exposed to the light is developed in the step (c) to form a resist circuit pattern and resist alignment-mark patterns in the resist layer from the circuit pattern and the alignment marks on the reticle, respectively. Each of the resist alignment-mark patterns includes resist sub-patterns corresponding to the sub-elements arranged in the specific direction. Then, two ones of the resist sub-patterns located at their two ends are selectively removed from each of the resist alignment-mark patterns in the step (d), forming amended resist alignment-mark patterns in the resist layer. Thereafter, alignment accuracy of the resist layer with respect to an underlying layer of the target layer is measured using the amended resist alignment-mark patterns in the step (e).

Accordingly, it is said that the two ones of the resist sub-patterns located at their two ends, which are removed in the step (d), correspond to the first and second auxiliary sub-elements in the reticle according to the first aspect. Also, it is said that the remaining resist sub-patterns correspond to the main sub-elements in the reticle according to the first aspect. As a result, there are the same advantages as those in the reticle according to the first aspect.

In the method according to the second aspect, the prior-art reticle described previously or the reticle according to the first aspect may be used as the reticle in the step (b).

In a preferred embodiment of the method according to the second aspect, each of the sub-elements of the mark elements has a linear shape, which may be continuous or broken (or divided) between its two ends.

In another preferred embodiment of the method according to the second aspect, the specific direction in which the sub-elements of the reticle are arranged is a measuring direction in the step (e).

In still another preferred embodiment of the method according to the second aspect, the pitch of the sub-elements of the reticle is substantially equal to a pitch of the circuit pattern of the reticle.

BRIEF DESCRIPTION OF THE DRAWINGS

In order that the present invention may be readily carried into effect, it will now be described with reference to the accompanying drawings.

FIG. 1 is a partial, schematic plan view showing the alignment mark of a prior-art reticle.

FIG. 2 is a partial, schematic plan view showing the detailed structure of the part of the alignment mark element of the prior-art reticle.

DETAILED DESCRIPTION OF THE PREFERRED EMBODIMENTS

Figure 3:
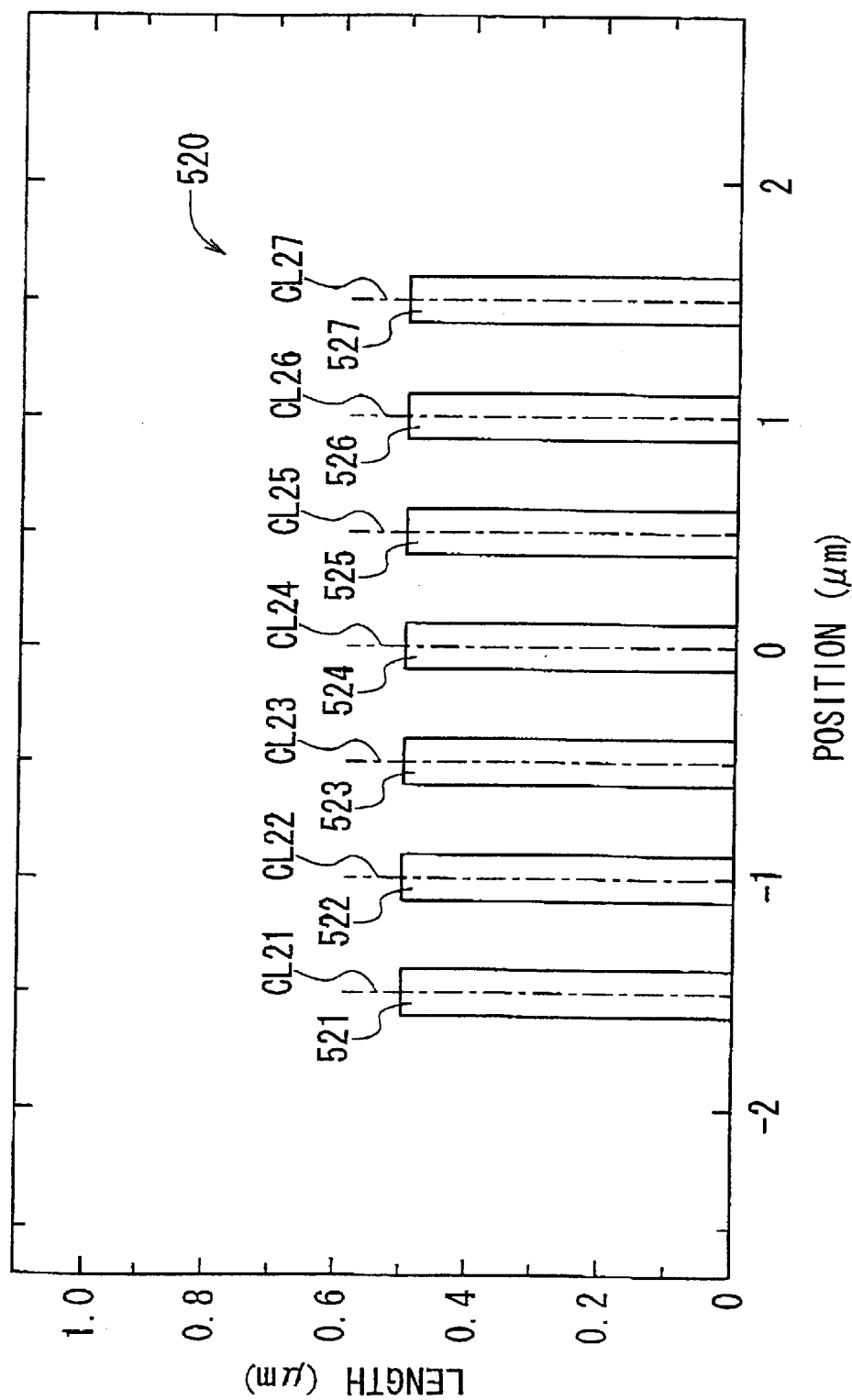
FIG. 3 is a partial, schematic plan view showing the resist pattern obtained by conducting the optical lithographic process using an ideal optical system of a stepper without any aberration.
Figure 4:
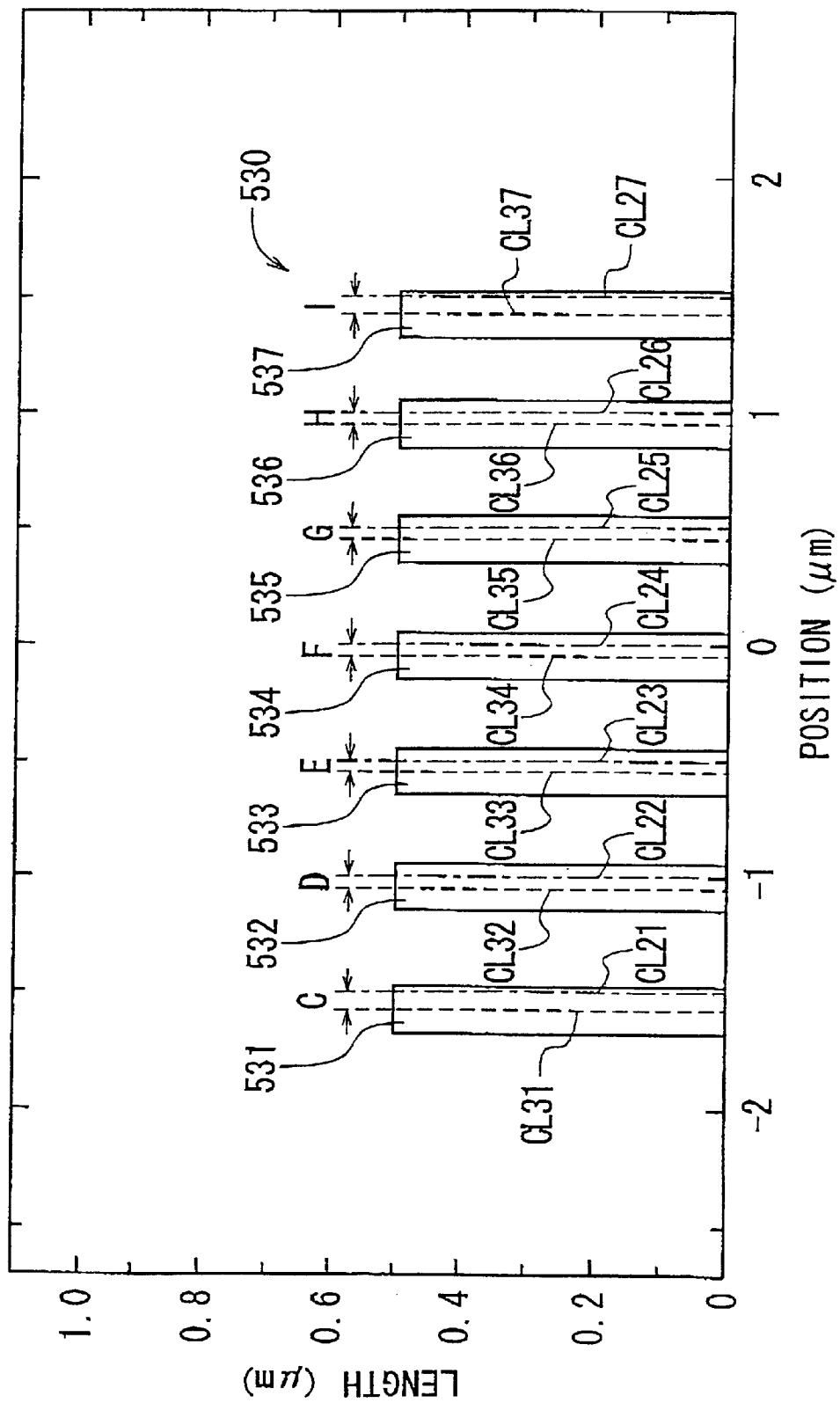
FIG. 4 is a partial, schematic plan view showing the resist pattern obtained by conducting the optical lithographic process using an actual optical system of a stepper with some aberration.
Figure 5A:
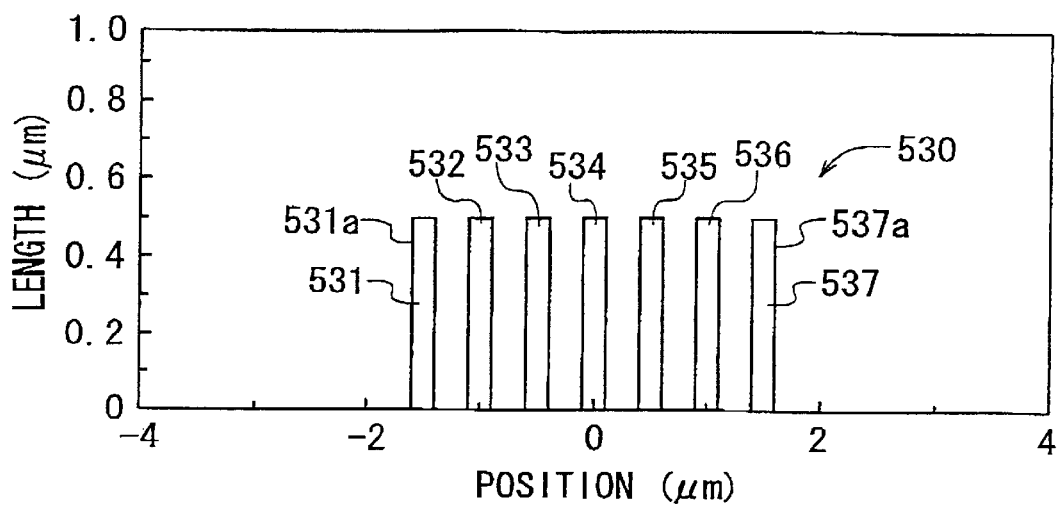
FIGS. 5A and 5B are schematic views of the resist pattern formed corresponding to the alignment mark and the reflected light intensity distribution using the prior-art reticle of FIG. 1, respectively.
Figure 5B:
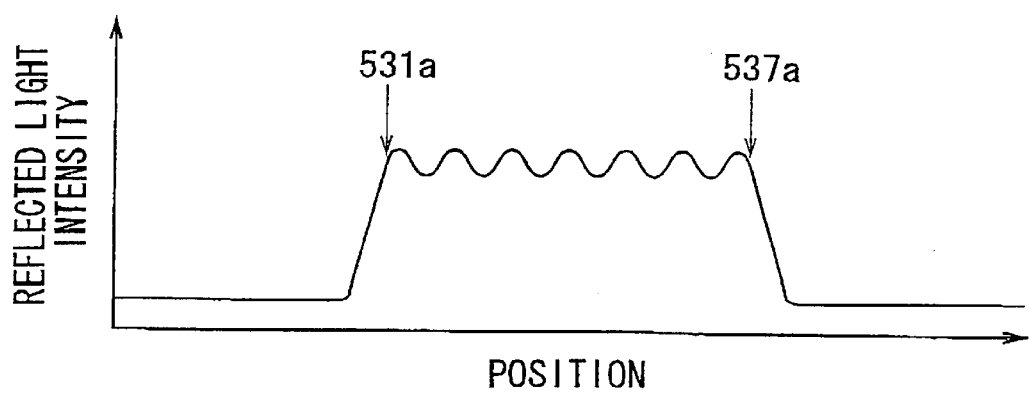

Preferred embodiments of the present invention will be described in detail below while referring to the drawings attached.

First Embodiment

Figure 6:
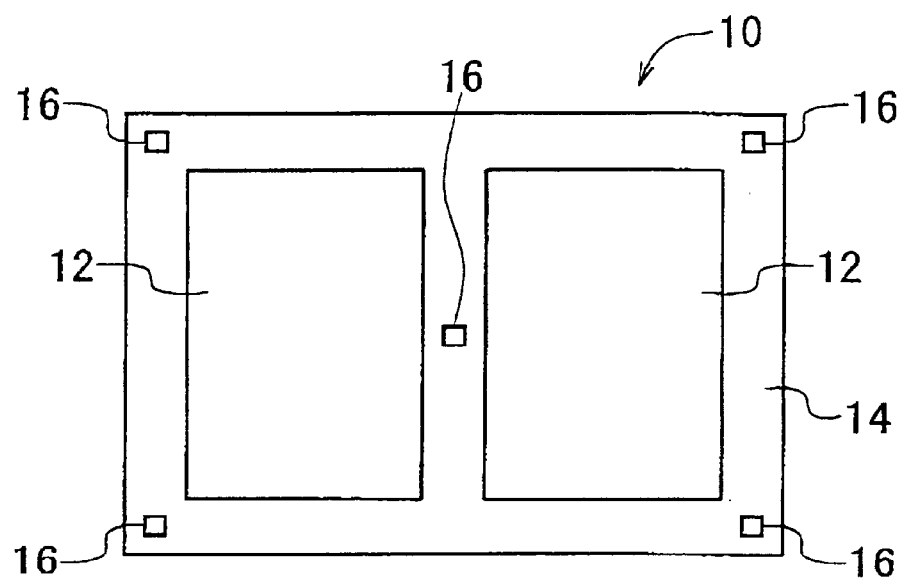
FIG. 6 is a partial, schematic plan view showing a reticle according to a first embodiment of the invention.
Figure 7:
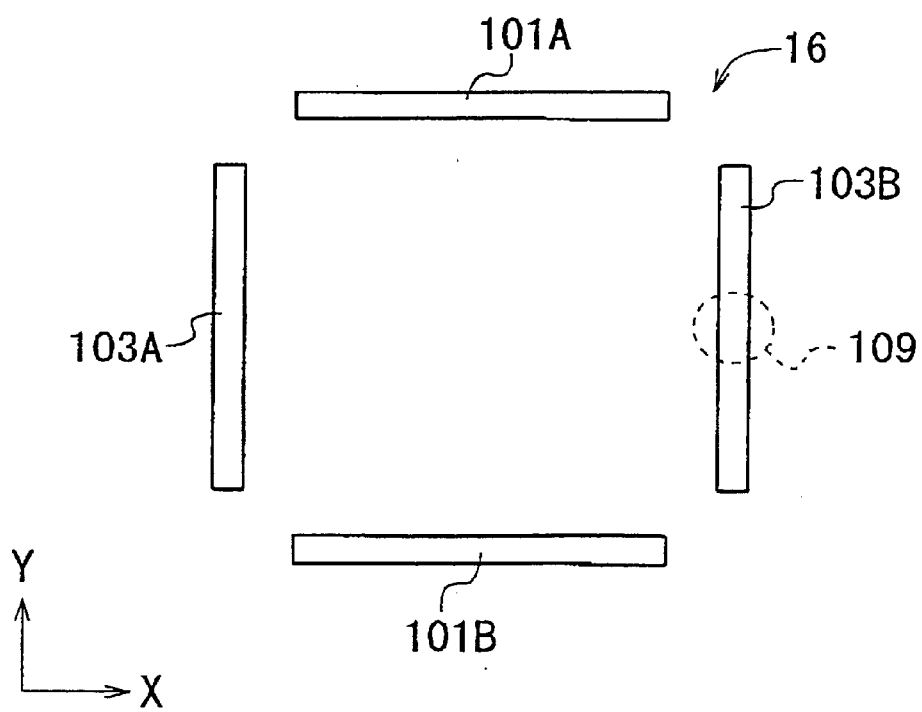
FIG. 7 is a schematic plan view showing the alignment mark of the reticle according to the first embodiment of FIG. 6.
Figure 8:
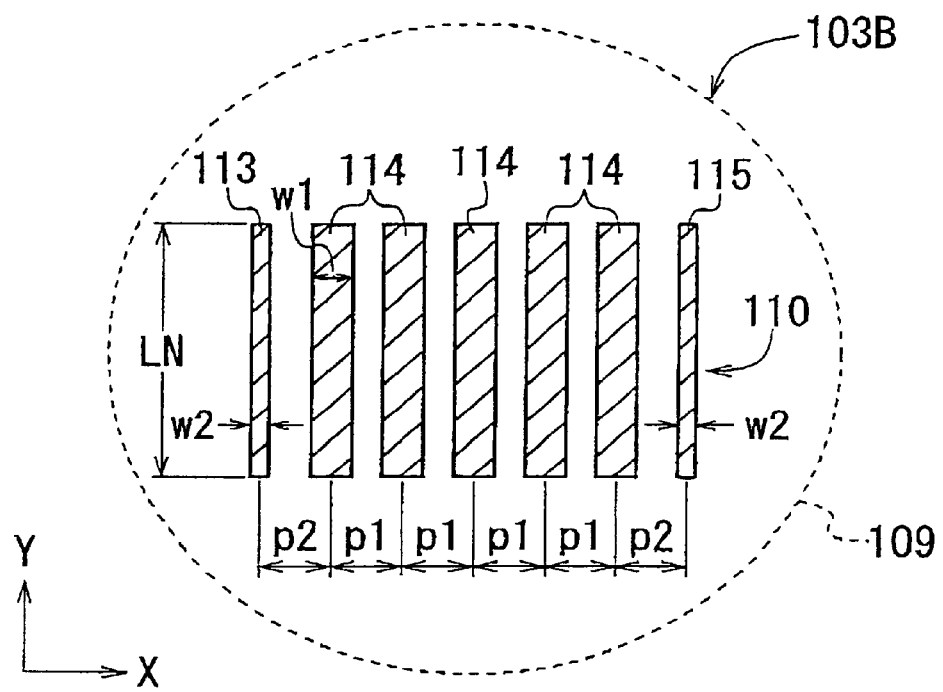
FIG. 8 is a partial, schematic plan view showing the detailed structure of the part of the alignment mark element of the reticle according to the first embodiment of FIG. 6.

A reticle according to a first embodiment of the invention is shown in FIGS. 6, 7, and 8.

As shown in FIG. 6, the reticle 10 according to the first embodiment, which is rectangular here, comprises a plurality of chip areas 12 and a scribe line area 14 formed to surround the chip areas 12. For the sake of simplification of description, only two ones of the chip areas 12 are illustrated in FIG. 6.

Circuit patterns for fabricating a desired semiconductor device, such as contact hole patterns and wiring patterns, are formed in each of the chip areas 12. Typically, the count of the circuit patterns formed on the reticle 10 is set to be equal to the number of chips projected simultaneously onto a semiconductor wafer at each exposure step.

The scribe line area 14 is entirely located in the projection area of a specific optical exposure system (not shown) Needless to say, all the chip areas 12 are entirely located in the same projection area. Five alignment marks 16 are formed in the scribe line area 14 to measure the alignment or stacking accuracy of the reticle 10. In FIG. 6, the marks 16 are located at four corners of the rectangular reticle 10 and the middle point of the two chip areas 12. The location of the marks 16 is not limited to this case and it may be optionally changed as desired.

As shown in FIG. 7, the mark 16 comprises four linear elements 101A, 101, 103A, and 103B which are respectively located at the four sides of an imaginary square. The two elements 101A and 101B, which extend along the X-axis, are parallel and apart from each other by a specific distance. The two elements 103A and 103B, which extend along the Y-axis perpendicular to the X-axis, are parallel and apart from each other by a specific distance.

FIG. 8 shows the detailed structure of the part 109 of the alignment mark element 103B shown in FIG. 7. As shown in FIG. 8, the part 109 of the element 103B includes a pattern 110 comprising five linear (i.e., strip-shaped) main sub-elements 114 with the same size and the same shape and two linear (i.e., strip-shaped) auxiliary sub-elements 113 and 115 with the same size and the same shape. A plurality of the patterns 110 are arranged at regular intervals along the Y-axis, thereby forming the element 103B.

The mark element 103A has the same structure as the element 103B shown in FIG. 8. The alignment mark elements 101A and 101B have the structure obtained by turning the element 103B by 90° around the center of the imaginary rectangle of the alignment mark 16.

The five main sub-elements 114 are formed to extend parallel to the Y-axis and to be arranged along the X-axis at equal pitches p1. The main sub-elements 114 have equal widths w1 and equal lengths Ln. The pitch p1 and the width w1 are substantially equal to those of the circuit pattern formed in each chip area 12 of the reticle 10. Thus, the optical conditions for the sub-elements 114 and the geometric shapes of the circuit pattern are substantially equal to each other, resulting in substantially equal effects being applied to the sub-elements 114 and the circuit pattern by aberration.

The two auxiliary sub-elements 113 and 115 are formed to extend parallel to the Y axis and to be respectively located apart from the adjoining main shapes 114 at equal pitches p2 along the X axis. The sub-elements 113 and 115 have equal widths w2 and the equal lengths LN. The pitch p2 is substantially equal to the pitch p1. The width w2, which is smaller than the width w1, is set at a specific value less than the exposure or resolution limit, in other words, the width w2 is set at an irresolvable value at optical exposure.

Each of the mark elements 101A, 101B, and 103A includes the same patterns as the pattern 110 shown in FIG. 8. The direction of the linear shapes 113, 114, and 115 of the element 103A is the same as the element 103B. The direction of the linear shapes 113, 114, and 115 of the elements 101A and 101B is perpendicular to the element 103B.

When the reticle 10 according to the first embodiment shown in FIGS. 6 to 8 is used for the optical lithographic process, the circuit patterns in the chip areas 12 and the alignment marks 16 in the scribe line area 14 of the reticle 10 are transferred onto an optical resist layer formed on the target layer (which may be 10 conductive or dielectric) over a semiconductor wafer. Thus, as shown in FIG. 9, a resist alignment mark 120 is formed on the resist layer.

Figure 9:
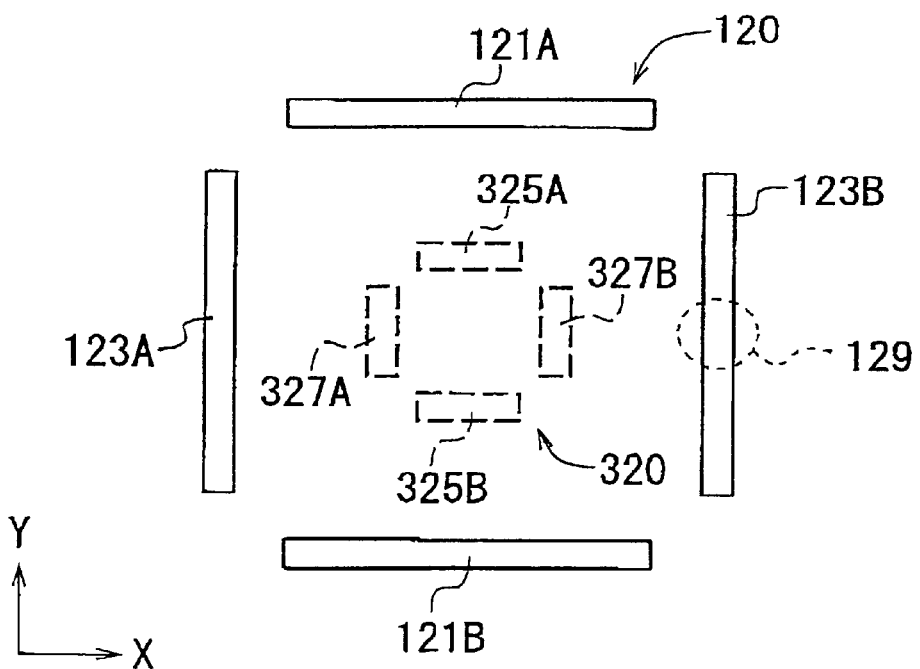
FIG. 9 is a partial, schematic plan view showing the resist pattern obtained by conducting the optical lithographic process using the reticle according to the first embodiment of FIG. 6 and an actual optical system of a stepper with some aberration.

As shown in FIG. 9, the resist alignment mark 120 comprises four linear resist mark elements 121A, 121B, 123A, and 123B which are respectively located at the four sides of an imaginary square. The elements 121A, 121B, 123A, and 123B correspond to the elements 101A, 101B, 103A, and 103B on the reticle 10, respectively. The two elements 121A and 121B, which extend along the X-axis, are parallel and apart from each other by a specific distance. The two elements 123A and 123B, which extend along the Y-axis perpendicular to the X-axis, are parallel and apart from each other by a specific distance.

Another alignment mark 320 of a layer underlying the target layer over the wafer is illustrated by broken lines in FIG. 9. This is to exhibit the positional relationship between these marks 120 and 320. As shown in FIG. 9, the upper-layer mark 120 is located to surround entirely the lower-layer mark 320.

Similar to the resist alignment mark 120, the mark 320 of the underlying layer comprises four rectangular mark elements 325A, 325B, 327A, and 327B, which are arranged to form an imaginary rectangle. The two elements 325A and 325B, which extend along the X-axis, are parallel and apart from each other by a specific distance. The two elements 327A and 327B, which extend along the Y-axis perpendicular to the X-axis, are parallel and apart from each other by a specific distance.

The alignment or stacking accuracy of the reticle 10 with respect-to the underlying layer is measured using the alignment mark 120 of the resist layer and the alignment mark 320 of the underlying layer in the following way.

For example, the interval (i.e., the inter-edge distance) between the alignment mark element 123A of the resist layer and the corresponding alignment mark element 327A of the underlying layer is optically measured and then, the interval (i.e., the inter-edge distance) between the element 1233 of the resist layer and the corresponding element 327B of the underlying layer is optically measured. Using the values of the intervals thus measured, the alignment or stacking error of the reticle 10 along the Y-axis is recognized. Subsequently, in a similar way to above, the interval between the element 121A of the resist layer and the corresponding element 325A of the underlying layer is measured and then, the interval between the element 121B of the resist layer and the corresponding element 325B of the underlying layer is measured. Using the values of the intervals thus measured, the alignment or stacking error of the reticle 10 along the X-axis is recognized.

In this example, the alignment accuracy measurement is carried out along the x and Y-axes and thus, it is said that the measurement directions are along the X- and Y-axes.

Instead of the measurement of the interval (i.e., the inter-edge distance) between the corresponding mark elements as explained above, the pitch between the corresponding mark elements may be measured.

Figure 10:
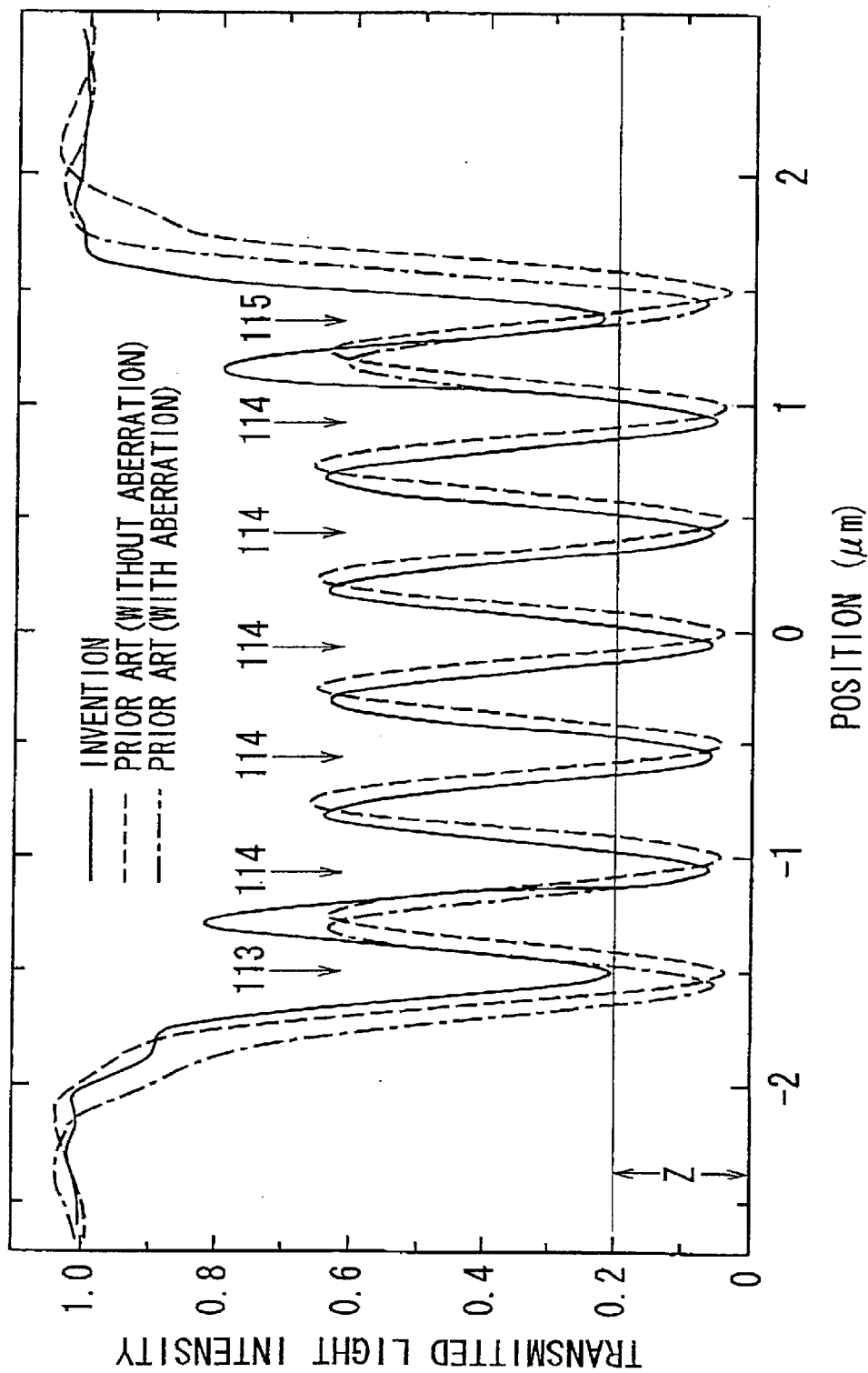
FIG. 10 is a schematic view showing the transmitted light intensity distribution when the reticle according to the first embodiment of FIG. 6 is used.

FIG. 10 shows the distribution of the transmitted light intensity of the alignment mark element 103B, which was given in the lithography process using the reticle 10 according to the first embodiment of FIG. 6. In FIG. 10, the distribution of the transmitted light intensity of the alignment mark element 503B is additionally shown, which was given in the lithography process using the prior-art reticle show in FIG. 1.

Figure 11:
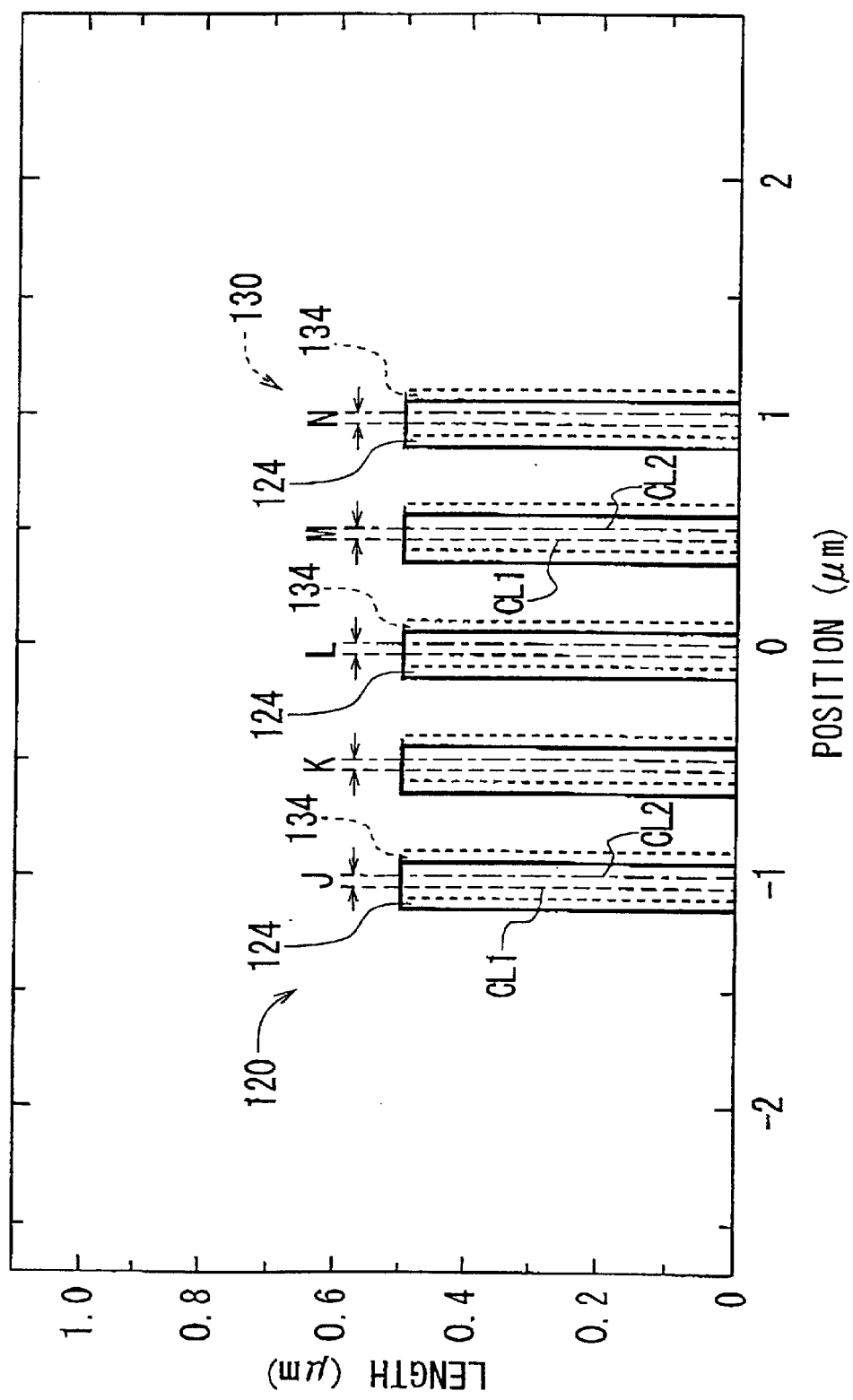
FIG. 11 is a partial, schematic plan view showing the resist pattern obtained by conducting the optical lithographic process using the reticle according to the first embodiment of FIG. 6 and an actual optical system of a stepper with some aberration.

As shown by the solid line curve in FIG. 10, in the lithography process using the reticle 10 according to the first embodiment, the transmitted light intensity has values lower than the threshold value Z in the regions corresponding to the main sub-elements 114 of the pattern 110 while it has values higher than the threshold value Z in the regions corresponding to the auxiliary sub-elements shapes 113 and 115 of the pattern 110. This means that the auxiliary sub-elements 113 and 115 are not transferred to the resist layer, thereby selectively transferring only the main sub-elements 114 onto the resist layer even if the resist layer thus exposed is then developed. Accordingly, in the part 129 of the alignment mark element 123B of the resist layer, a resist pattern 120 shown in FIG. 11 is formed, which comprises only linear resist sub-elements 124 corresponding to the main sub-elements 114 of the pattern 110.

Since the optical system of the stepper includes some aberration, the centerlines CL1 of the resist sub-elements 124 are deviated from the centerlines CL2 of the resist sub-elements 134 by specific shifts J, K, L, M, and N, respectively. The-centerlines CL2 of the resist sub-elements 134 are given when the optical system of the stepper includes no aberration. In this case, however, the optical condition (i.e., the diffraction level) for all the sub-elements 114 is equal, because the auxiliary sub-elements 113 and 115 are arranged at each edge of the pattern 110 to sandwich the main sub-elements 114. As a result, the shifts J, K, L, M, and N are substantially equal in value to each other. This means that all the main sub-elements 124 have substantially equal spacial frequency characteristics to each other.

Additionally, as seen from the broken and chain lines in FIG. 10, in the lithography process using the prior-art reticle shown in FIG. 1, the transmitted light intensity has values lower than the threshold value Z in the regions corresponding to the sub-elements 511 to 517 of the pattern 510. This means that all the sub-elements 511 to 517 are transferred onto the resist layer, which is dissimilar to the first embodiment of the invention and induces the previously-described problems.

As explained above, with the reticle 10 according to the first embodiment, each of the elements 101A, 101B, 103A, and 103B of each alignment mark 16 includes the patterns 110 each comprising the linear main sub-elements 114 and the linear auxiliary sub-elements 113 and 115. The auxiliary sub-elements 113 and 115 are located at each edge of the pattern 110 to sandwich the main sub-elements 114. The widths w2 of the auxiliary sub-elements 113 and 115 have a value less than the exposure limit of the resist layer.

Accordingly, only the main sub-elements 114 are selectively transferred onto the resist layer even if the auxiliary sub-elements 113 and 115 exist on the reticle 10. Thus, all the sub-elements 124 have substantially equal spacial frequency characteristics. As a result, the error or incorrectness at the alignment accuracy measurement using the alignment mark 10 can be reduced and the alignment accuracy in the optical lithographic process can be improved.

Second Embodiment

Figure 12:
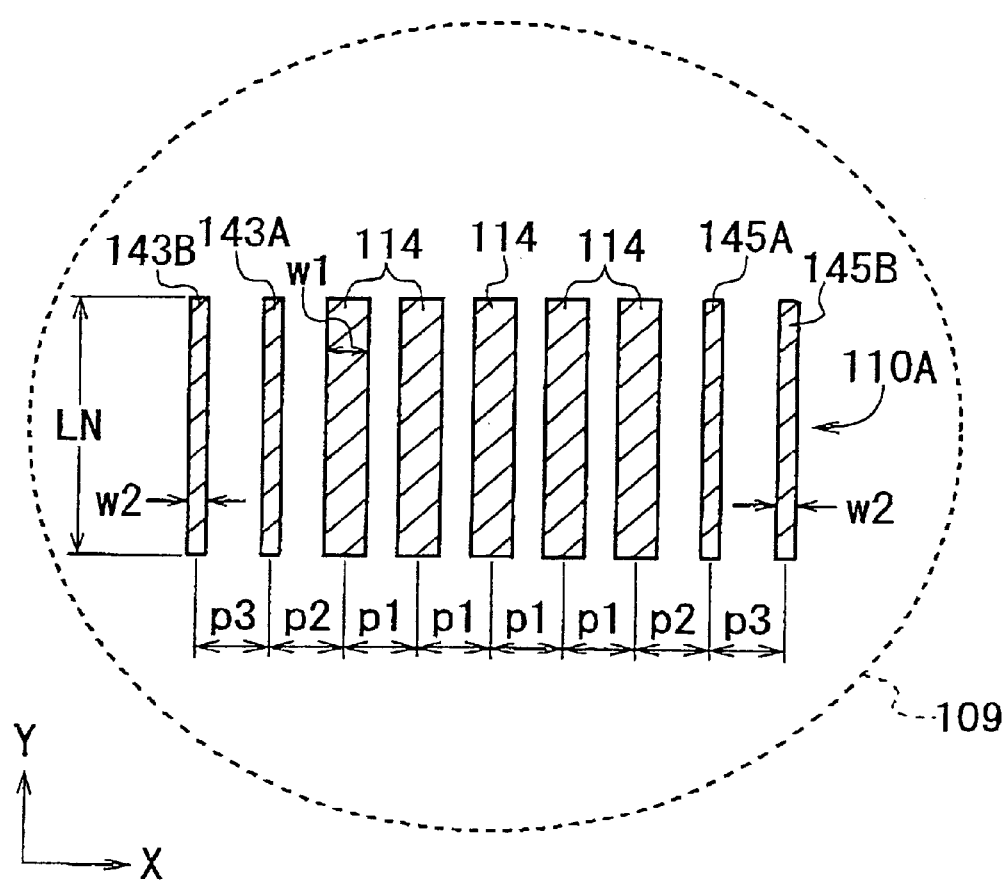
FIG. 12 is a partial schematic plan view showing the detailed structure of the part of the alignment mark element of a reticle according to a second embodiment of the invention.

A reticle according to a second embodiment of the invention has the same configuration as that of the reticle 10 according to the first embodiment, except that the part 109 of the alignment mark element 103B has the structure shown in FIG. 12. Thus, the explanation about the same configuration as the reticle 10 is omitted here for the sake of simplification by attaching the same reference symbols as used the first embodiment to the same or corresponding elements in FIG. 12.

The alignment mark element 103B of the reticle according to the second embodiment comprises patterns 110A each having the configuration as shown in FIG. 12. The patterns 110A are arranged at regular intervals along the Y-axis, forming the mark element 103b. As shown in FIG. 12, the pattern 110A includes five linear main sub-elements 114 and four linear auxiliary sub-elements 143A, 143B, 145A, and 145B. The auxiliary sub-elements 143A and 145A are located near the adjoining two main sub-elements 114, respectively. The auxiliary sub-elements 143B and 145B are located at each edge of the pattern 110A and are respectively adjacent to the auxiliary sub-elements 143A and 145A. It is said that the main sub-elements 114 are sandwiched by the outermost auxiliary sub-elements 143 and 145.

The main sub-elements 114 have equal widths w1 and equal lengths LN. The sub-elements 114 extend parallel to the Y-axis and are arranged along the X-axis at equal pitches p1. The width w1 and pitch p1 are substantially equal to the width and pitch of the geometric shapes of each circuit pattern in the chip areas 12 of the reticle, respectively.

The auxiliary sub-elements 143A, 143B, 145A, and 145B have equal widths w2 and the equal lengths LN. The sub-elements 143A and 143B extend parallel to the Y axis and are respectively located apart from the adjoining main sub-elements 114 at equal pitches p2 along the X axis. The sub-elements 145A and 145B extend parallel to the Y-axis and are respectively located apart from the adjoining auxiliary sub-elements 143A and 143B at equal pitches p3 along the X-axis. The pitches p2 and p3 are equal to the pitch p1.

The width w2, which is smaller than the width w1, is set at a specific value less than the exposure or resolution limit (i.e., an irresolvable value at optical exposure)

As explained above, with the reticle according to the second embodiment of FIG. 12, similar to the first embodiment, only the main sub-elements 114 are selectively transferred onto the resist layer even if the auxiliary sub-elements 143A, 143B, 145A, and 145B exist. Thus, the sub-elements 124 have substantially equal spacial frequency characteristics to each other. Since the auxiliary sub-elements 143B and 145B are additionally provided compared with the reticle 10 of the first embodiment, the obtainable equality of the spacial frequency characteristic is enhanced. As a result, the alignment accuracy can be more improved and at the same time, the error or incorrectness of alignment accuracy measurement can is reduced more effectively, compared with the first embodiment.

Third Embodiment

Figure 13:
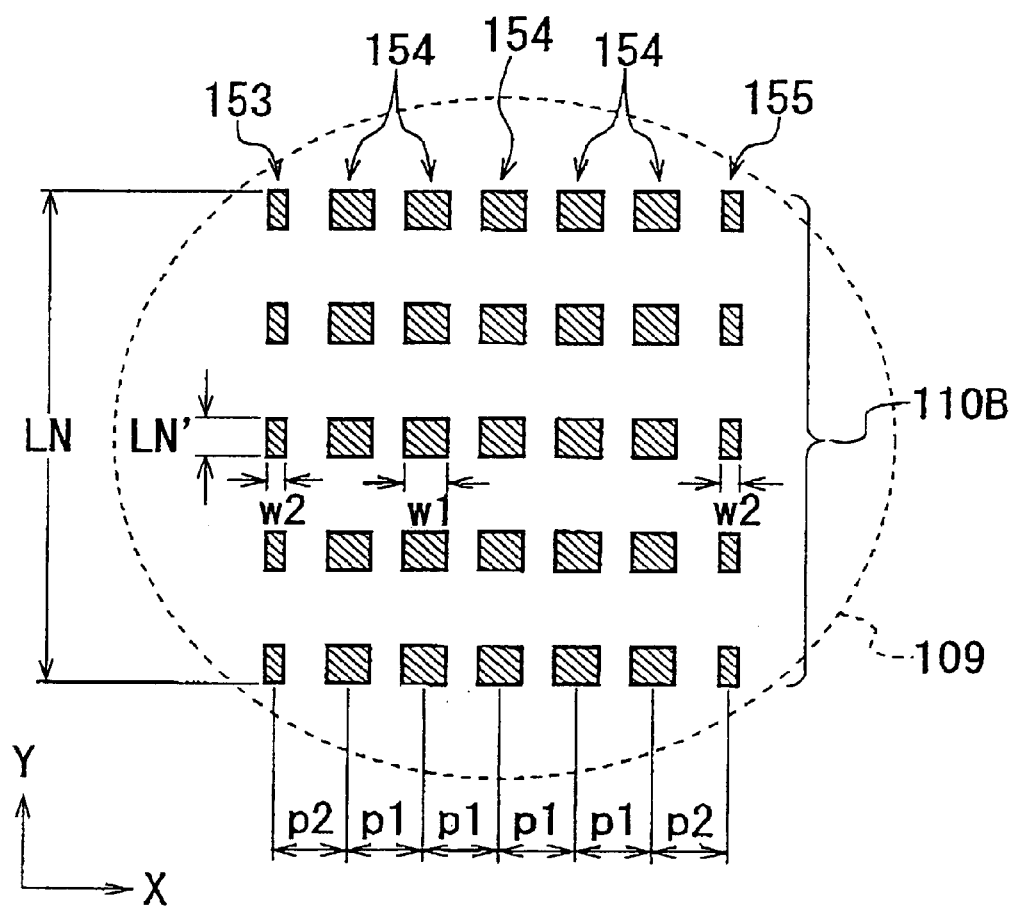
FIG. 13 is a partial, schematic plan view showing the detailed structure of the part of the alignment mark element of a reticle according to a third embodiment of the invention.

A reticle according to a third embodiment of the invention has the same configuration as that of the reticle 10 according to the first embodiment, except that the part 109 of the alignment mark element 103B has the structure shown in FIG. 13. Thus, the explanation about the same configuration as the reticle 10 is omitted here for the sake of simplification by attaching the same reference symbols as used the first embodiment to the same or corresponding elements in FIG. 13.

The alignment mark element 103B of the reticle of the third embodiment comprises patterns 110B each having the configuration as shown in FIG. 13. The patterns 110B are arranged at regular intervals along the Y-axis, forming the mark element 103b. As shown in FIG. 13, the pattern 110B includes five linear broken-lined main sub-elements 154 and two linear broken-lined auxiliary sub-elements 153 and 155. The auxiliary sub-elements 153 and 155 are located near the adjoining main sub-elements 154, respectively. The auxiliary sub-elements 15B and 155 are located at each edge of the pattern 110B. It is said that all the main sub-elements 154 are sandwiched by the auxiliary sub-elements 153 and 155.

As seen from FIG. 13, it is said that the structure of the pattern 110B is the same as that of the pattern 110 of the first embodiment, except that each of the sub-elements 153 to 155 is formed by dividing or breaking the sub-elements 114, and 143A, 143B, 145A, and 145B into pieces (i.e., rectangular isolated dots or points), respectively.

Each of the main sub-elements 154 is formed by five rectangular dots having equal sizes which are arranged at regular intervals along the Y-axis. The dots have equal widths w1 and equal lengths LN'. Similarly, each of the auxiliary sub-elements 153 and 155 are formed by five rectangular dots having equal sizes which are arranged at regular intervals along the Y-axis. The dots have equal widths w2 (which is less than w1) and equal lengths LN' (which is less than LN).

As explained above, with the reticle according to the third embodiment of FIG. 13, there are the same advantages as those in the first embodiment.

Fourth Embodiment

With the above-explained reticle 10 according to the first embodiment, the linear auxiliary sub-elements 113 and 115 have the width w2 less than the exposure limit and therefore, the auxiliary sub-elements 113 and 115 are not transferred to the photoresist layer. This is applicable to the reticles according to the second and third embodiments.

Figure 14:
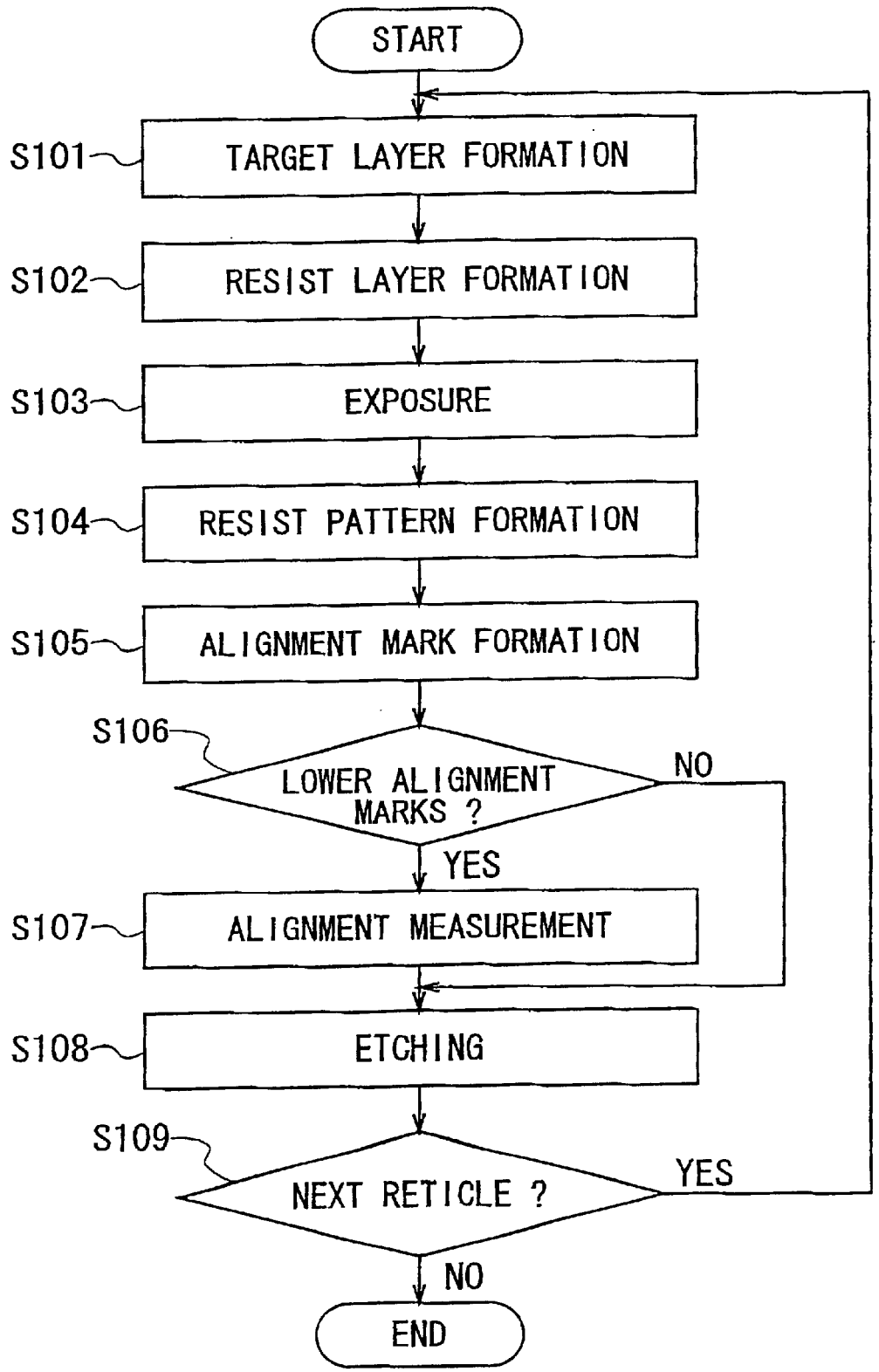
FIG. 14 is a flowchart showing the process steps of a method of fabricating a semiconductor device according to a fourth embodiment of the invention.

With the fourth embodiment of the invention, unlike this, a method of fabricating a semiconductor device is provided, which uses a reticle all alignment marks of which have widths greater than the exposure limit. The process steps of the method according to the fourth embodiment are shown by the flowchart in FIG. 14.

First, in the step S101, a target layer 402 (which may be dielectric or conductive) to be subjected to the pattern transfer process is formed on an underlying layer 401, which is formed over the main surface of a semiconductor wafer (not shown), as shown in FIG. 1. Then, an optical resist layer 403 is formed on the target layer 402 to cover the whole surface of the wafer in the step S102.

As the target layer 402, for example, a silicon dioxide ($SiO_2$) or polysilicon layer formed by Chemical Vapor Deposition (CVD) or a metal layer formed by sputtering may be used.

In the step S103, the resist layer 403 is exposed to specific exposure light such as ultraviolet (UV) light using a reticle. As the reticle, for example, the prior-art reticle having the alignment marks 500 as shown in FIGS. 1 and 2, in which all the linear sub-elements 511 to 517 have equal widths greater than the exposure limit, is used.

Figure 15A:
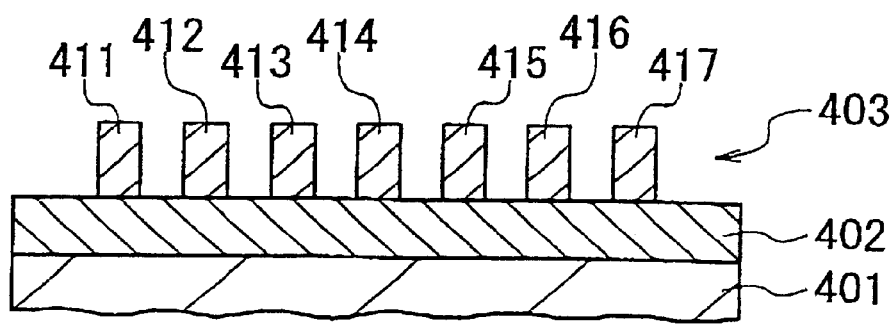
FIGS. 15A to 15D are partial, schematic cross-sectional views showing the process steps of the method according to the fourth embodiment of FIG. 14, respectively.

In the step S104, the resist layer 403 thus exposed to UV light is developed using an ordinary developer solution, thereby forming seven linear sub-elements 411, 412, 413, 414, 415, 416, and 417 in the resist layer 403, as shown in FIG. 15A. These sub-elements 411 to 417, which have equal sizes and equal shapes, are arranged at equal intervals or pitches along a specific axis (e.g., along the X axis in FIGS. 1 and 2).

Figure 15B:
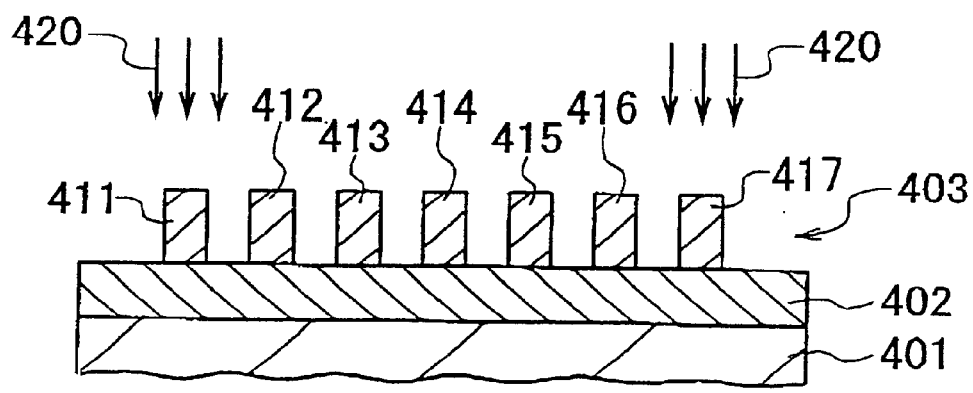
Figure 15C:
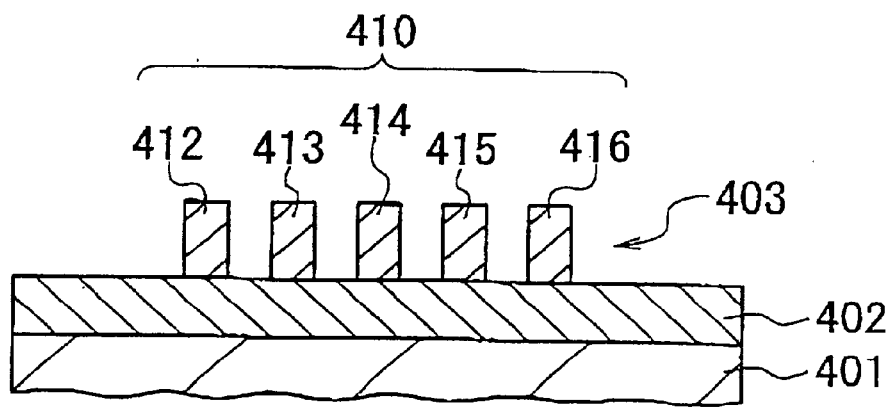
Figure 15D:
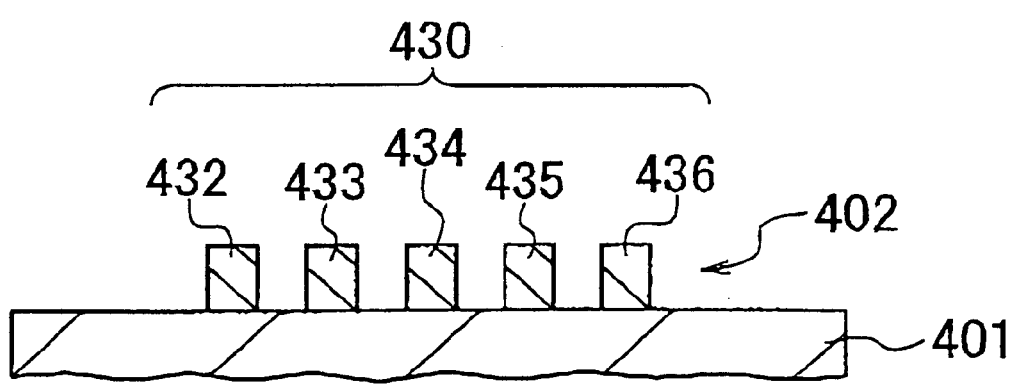

Subsequently, in the step S105, the sub-elements elements 411 and 417 located at the two edges of the resist pattern in the resist layer 403 are removed by a known method. For example, as shown in FIG. 15B, an electron beam (or, an ion beam) 420 is selectively irradiated to the sub-elements 411 and 417 and then, the resist layer 403 is developed again using an ordinary developer solution. Thus, only the sub-elements 411 and 417 are removed while the sub-elements 412, 413, 414, 415, and 416 are left unchanged. The state at this stage is shown in FIG. 15C. The remaining sub-elements 412 to 416 of the resist layer 403 constitute the resist alignment mark 410.

In the step S106, it is judged whether or not any lower alignment mark exists in the underlying layer 401. If the layer 401 includes no alignment mark (i.e., the answer is "NO"), the flow is jumped to the step S108. If the layer 401 includes any alignment mark (i.e., the answer is "YES"), the flow is progressed to the next step S107.

In the step S107, the alignment accuracy or error of the resist alignment mark 410 in the patterned resist layer 403 with respect to the lower alignment mark in the layer 401 is optically measured by an ordinary method.

In the step S108, the target layer 402 is selectively etched using the patterned resist layer 403 as a mask, thereby transferring the resist alignment mark 410 in the resist layer 403 to the target layer 402. As a result, an image of the mark 410 comprising five linear sub-elements 432, 433, 434, 435, and 436 is formed in the target layer 402 along with the circuit patterns. The image comprising the sub-elements 432 to 436 constitute the alignment mark 430 formed in the target layer 402.

In the step S109, it is judged whether or not a next reticle exists. If no next reticle exists (i.e., the answer is "NO"), the flow is finished. If any next reticle exists (i.e., the answer is "YES"), the flow is returned to the step S101 and then, the above-explained steps S101 to S109 are carried out again.

For example, first, the steps S101 to S109 are carried out using a first reticle with first circuit patterns and first alignment marks. Thus, first circuit patterns (not shown) and first alignment marks are formed in a first target layer.

Next, the steps S101 to S106 are carried out again using a second reticle with second circuit patterns and second alignment marks. Thus, second circuit patterns (not shown) and second alignment marks (not shown) are formed in a second optically resist layer formed on a second target layer. In this example, the judgment in the step S106 is "YES" and therefore, the alignment accuracy between the first alignment mark in the first target layer and the second alignment mark of the second resist layer is measured in the step S107. Thereafter, in the step S108, the second circuit patterns and the second alignment marks are transferred to the second target layer.

Moreover, if a third reticle with third circuit patterns and third alignment marks is present, the judgment result in the step S109 is "YES" and thus, the steps S101 to S109 are carried out one more time.

With the method of a semiconductor device according to the fourth embodiment of the invention, as explained above, the linear sub-elements 411 to 417 are formed in the resist layer 403 corresponding to the sub-elements of each alignment mark on the reticle in the step S104 and then, the two sub-elements 411 and 417 located at the two edges are selectively removed to leave the sub-elements 412 to 416 that constitute the resist alignment mark 410. In the step S108, the target layer 402 is selectively etched using the patterned resist layer 403 having the alignment mark 410, thereby forming the sub-elements 432 to 436 constituting the alignment mark 430 in the layer 402. The mark 410 is used in the alignment-accuracy measurement process in the step S107.

The sub-elements 412 to 416 in the resist layer 403 are equivalent to the sub-elements 124 shown in FIG. 11 produced by using the reticle 10 according to the first embodiment and therefore, the resist sub-elements 412 to 416 have substantially the same spacial frequency characteristic. Also, the sub-elements 432 to 436 in the target layer 402 have substantially the same spacial frequency characteristic. As a result, there are the same advantages as the fabrication method using the reticle 10 according to the first embodiment.

Variations

In the above-described reticles according to the first to third embodiments, the alignment mark 16 comprises the four mark elements 101A, 101B, 103A, and 103B, which is termed the "bar-in target". However, the present invention is not limited to this structure. The mark 16 may comprise elements with any shape and any arrangement.

In the above-described method of fabricating a semiconductor device according to the fourth embodiment, all the sub-elements of each alignment mark of the reticle have a width greater than the specific exposure limit of the exposure apparatus. However, it is needless to say that any one of the reticles according to the first to third embodiments may be used. For example, if the auxiliary sub-elements have a width near the exposure limit, an image of the auxiliary sub-elements may be slightly formed in the resist layer. In this case, if one of the reticles according to the first to third embodiments is used to carry out the method according to the fourth embodiment, the advantages of the invention can be ensured.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of fabricating a semiconductor device, comprising the steps of:
   (a) forming an optical resist layer on a target layer located over a surface of a semiconductor wafer;
   (b) irradiating light on said resist layer through a reticle including a first area including a desired circuit pattern and a second area including alignment marks arranged at specific positions; wherein
      said first area and said second area are irradiated by said light;
      each of said alignment marks include mark elements arranged to form a first geometric shape;
      each of said mark elements sub-elements arranged in a specific direction at specific pitches to form a second geometric shape;
   (c) developing said resist layer exposed to said light to form a resist circuit pattern and resist alignment-mark patterns in said resist layer from said circuit pattern and said alignment marks on said reticle, respectively;
   wherein each of said resist alignment-mark patterns including resist sub-patterns corresponding to said sub-elements arranged in the specific direction;
   (d) selectively removing a resist sub-pattern from each end of each of said resist alignment-mark patterns, forming amended resist alignment-mark patterns in said resist layer;
   (e) measuring alignment accuracy of said resist layer with respect to an underlying layer of said target layer using said amended resist alignment-mark patterns; and,
   (f) selectively etching said target layer using said resist layer with said amended resist alignment-mark patterns.

2. The method according to claim 1, wherein each of said sub-elements of said mark elements has a linear shape.

3. The method according to claim 2, wherein the linear shape of each of said sub-elements of said mark elements is continuous between its two ends.

4. The method according to claim 2, wherein the linear shape of each of said sub-elements of said mark elements is divided between its two ends.

5. The method according to claim 1, wherein the specific direction in which said sub-elements of the reticle are arranged is a measuring direction in the step (e).

6. The method according to claim 1, wherein the pitch of said sub-elements of said reticle is substantially equal to a pitch of said circuit pattern of said reticle.

7. The method according to claim 1, wherein step (d) also involves selectively removing a second resist sub-pattern from each end of each of said resist alignment-mark patterns to form the amended resist alignment-mark patterns in said resist layer.

* * * * *